(12) United States Patent
Yang et al.

(10) Patent No.: US 10,319,632 B2
(45) Date of Patent: Jun. 11, 2019

(54) SEMICONDUCTOR INTERCONNECT STRUCTURE HAVING A GRAPHENE BARRIER LAYER

(71) Applicant: Taiwan Semiconductor Manufacturing Co., Ltd., Hsinchu (TW)

(72) Inventors: Shin-Yi Yang, New Taipei (TW); Ming-Han Lee, Taipei (TW); Shau-Lin Shue, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/675,498

(22) Filed: Aug. 11, 2017

(65) Prior Publication Data

US 2018/0166333 A1 Jun. 14, 2018

Related U.S. Application Data

(60) Provisional application No. 62/434,115, filed on Dec. 14, 2016.

(51) Int. Cl.
*H01L 21/768* (2006.01)
*H01L 23/532* (2006.01)

(52) U.S. Cl.
CPC ...... *H01L 21/76843* (2013.01); *H01L 21/768* (2013.01); *H01L 21/76807* (2013.01); *H01L 21/76864* (2013.01); *H01L 21/76867* (2013.01); *H01L 21/76879* (2013.01); *H01L 23/53223* (2013.01); *H01L 23/53233* (2013.01); *H01L 23/53238* (2013.01); *H01L 23/53252* (2013.01); *H01L 23/53266* (2013.01); *H01L 23/53295* (2013.01); *H01L 2221/1036* (2013.01)

(58) Field of Classification Search
CPC .................................................. H01L 29/1606
See application file for complete search history.

(56) References Cited

U.S. PATENT DOCUMENTS

| 9,324,634 B2* | 4/2016 | Bao | H01L 21/76846 |
| 2012/0139114 A1* | 6/2012 | Zhang | H01L 21/76849 257/751 |
| 2013/0048951 A1* | 2/2013 | Heo | B82Y 10/00 257/29 |
| 2014/0167268 A1* | 6/2014 | Bao | H01L 23/53276 257/761 |
| 2015/0137377 A1* | 5/2015 | Bao | H01L 23/5226 257/758 |
| 2016/0056228 A1* | 2/2016 | Jou | H01L 23/5223 257/532 |

* cited by examiner

*Primary Examiner* — Thao P Le
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a semiconductor interconnect structure incorporating a graphene barrier layer. The present disclosure provides a method of forming a graphene barrier layer on select surfaces using a self-assembly monolayer (SAM). The SAM layer can be selectively formed on dielectric surfaces and annealed to form thin graphene barrier layers. The thickness of the graphene barrier layers can be selected by choosing different alkyl groups of the SAM layer.

20 Claims, 10 Drawing Sheets

SEMICONDUCTOR INTERCONNECT STRUCTURE HAVING A GRAPHENE BARRIER LAYER

This application claims the benefit of U.S. Provisional Patent Application No. 62/434,115, titled "Semiconductor Interconnect Structure Having a Graphene Barrier Layer," which was filed on Dec. 14, 2016 and is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1A:
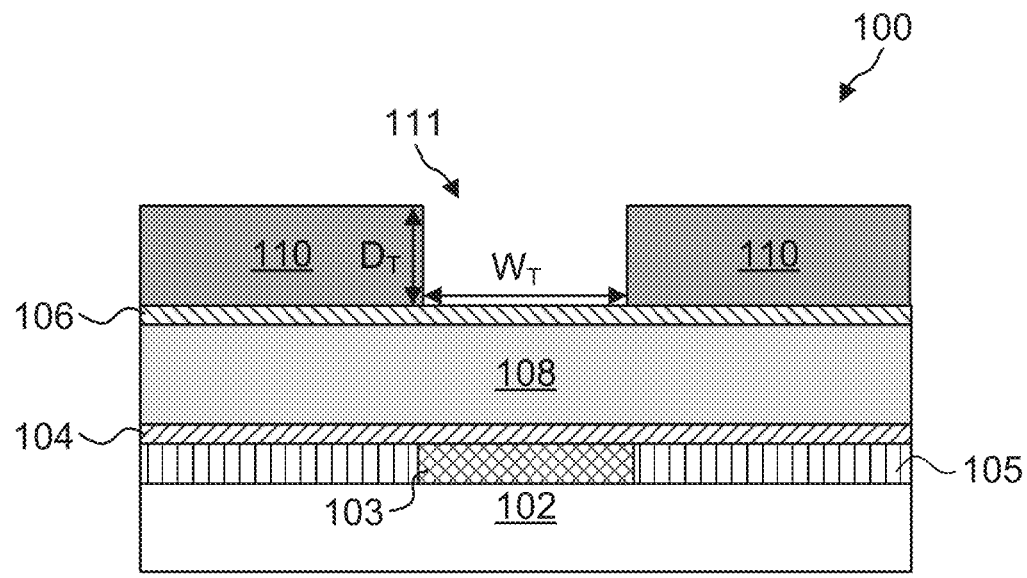
FIGS. 1A-2D are cross-sectional views of a partially-formed semiconductor interconnect structure formed using dual damascene processes, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity varies by ±5% of the value.

The term "about" as used herein indicates the value of a given quantity varies by ±10% of the value.

Semiconductor interconnect fabrication processes between front end of line (FEOL) and back end of line (BEOL) stages of the integrated circuit fabrication process include a metallization process that produces openings in a pre-metal dielectric (PMD) layer (e.g., silicon oxide ($SiO_2$)) and a process to fill these openings with metal (e.g., tungsten (W)). The metallization processes can be accomplished using a damascene process. The damascene process become widely used in integrated circuit manufacturing. The damascene process can involve creating interconnect schemes by cutting trenches into a dielectric and then filling those trenches with metal. Excess metal can be polished away.

Damascene processes can involve creating interconnect structures by cutting trenches and/or vias into a dielectric layer and then filling those trenches and/or vias with conductive material. An example of a damascene process is a dual damascene process, which creates trenches and vias in the dielectric layer and deposits conductive material in both features. The dual damascene process can include multiple patterning and etch steps such as, for example, a first patterning/etch step that forms vias in the dielectric layer so as to provide electrical connection with the underlying metal layer, and a second patterning/etch step to form trenches for the conductive lines. The two patterning/etch steps can be performed in different orders such as, for example, in a (i) trench first then via order; or (ii) a via first then trench order. The dual damascene process can also be a self-aligned dual damascene process using etch stop layers.

Metal such as copper (Cu) can be used in damascene processes as a bulk filling interconnect metal in the trenches and vias because of its low resistance compared to tungsten. However, copper oxidation or diffusion can occur between copper and many common insulating dielectric materials, such as silicon oxide and oxygen containing polymers. For example, copper deposited on an oxide can form copper oxide at or near 200° C. Further, copper can diffuse with a polyimide material during high temperature processing, causing corrosion of the copper and the polyimide material. The corrosion can result in loss of adhesion, delamination, voids, and failure of the device.

To prevent metal diffusion and oxidation, barrier layers can be incorporated into the damascene process using refractory metals. Materials such as titanium nitride (TiN), tantalum nitride (TaN), or other nitride containing refractory metals can be used as barrier layers. In addition, other materials that prevent copper diffusion or oxidation, promote adhesion, and possess appropriate electrical properties can also be used as barrier layers. Barrier layers can be deposited using physical vapor deposition (PVD)-based techniques, which deliver aspect-ratio dependent bottom and sidewall coverage thicknesses. Another example of barrier layer deposition method is an atomic layer deposition (ALD). For example, TaN can be deposited using ALD, delivering a conformal barrier in the contact areas.

As technologies progress, integrated circuits are characterized by decreasing dimension requirements over previous generation devices. As device geometries shrink, dimensions of the metal interconnections are also reduced. The barrier layer thickness is scaled down in order to reduce the resistance increase associated with the smaller contacting area and to maintain device reliability.

Graphene or graphene-based material provides chemical stability and reliability and can be an effective barrier layer for preventing metal diffusion or oxidation in vias or metal interconnect structures. For example, a graphene-based barrier layer can be used as a suitable barrier layer on the sidewalls or the bottom of the contact opening in the metal interconnects between FEOL and BEOL. Further, minimal body thickness made possible by thin layered graphene-based materials can allow further reduction in device dimension without sacrificing device performance. Therefore, the implementation of suitable graphene-based materials as barrier layers in metal interconnect structures can yield further scaled, high-performance low-power devices adaptable for aggressive (e.g., sub 7 nm or sub 5 nm and beyond) design rules.

Various embodiments in accordance with this disclosure provides methods of forming a graphene barrier layer on select surfaces using a self-assembly monolayer (SAM layer). A SAM layer is an organized layer that can be selectively grown on certain surfaces. To form graphene barrier layers, a SAM layer with alkyl groups can be formed on the dielectric surfaces of the opening but not on metal surfaces. Through an annealing process, carbon atoms in the alkyl group can be tightly bonded to form graphene. The thin graphene formation maximizes the volume of the conductive material in the opening. Further, graphene-based barrier layers formed using SAM layers can avoid diffusion or oxidation of the conductive material and in turn prevents the formation of metal oxide in and around the conductive contact in semiconductor interconnect structures.

In accordance with various embodiments of this disclosure, using SAM layers to form graphene barrier layers in semiconductor interconnect structures provides, among other things, benefits of (i) low sheet resistance by utilizing the thin thickness of graphene layers and maximizing the volume of conductive material in interconnects structure; (ii) low contact resistance by utilizing the surface selectivity of the SAM layer and forming a graphene barrier layer on select surfaces; (iii) enhanced device reliability as graphene-based barrier layers inhibit diffusion and reaction between the layers that are in contact with the barrier layers; (iv) controllable thickness of graphene-based barrier layer by adjusting the SAM layer's thickness; and (v) improved device reliability due to chemical stability and reliability of the graphene barrier layers.

Figure 1B:
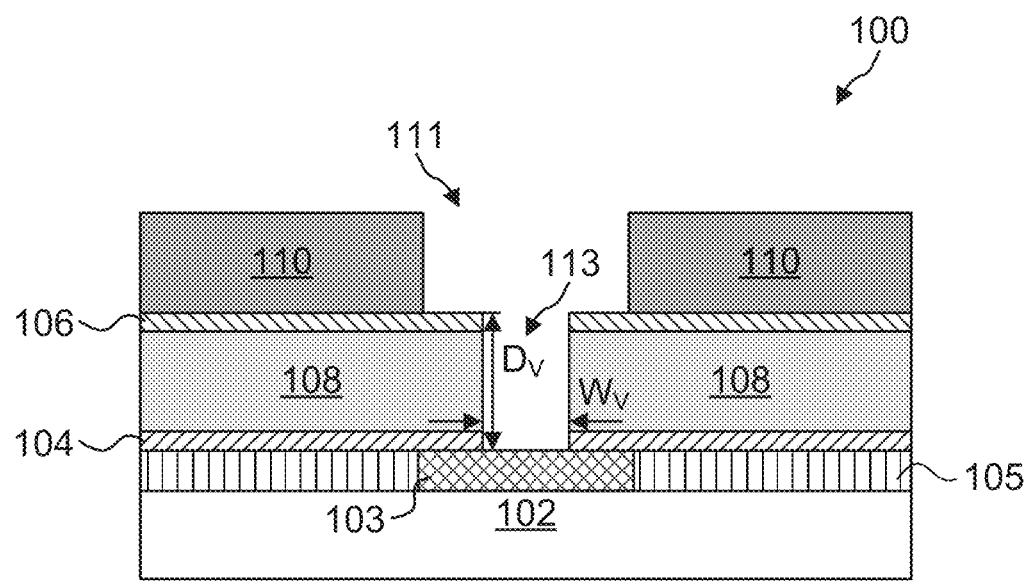
Figure 1C:
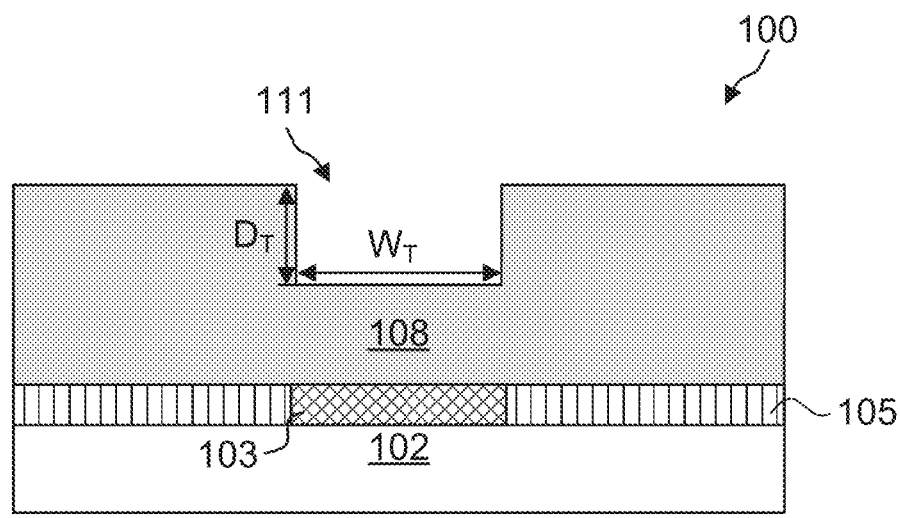
Figure 1D:
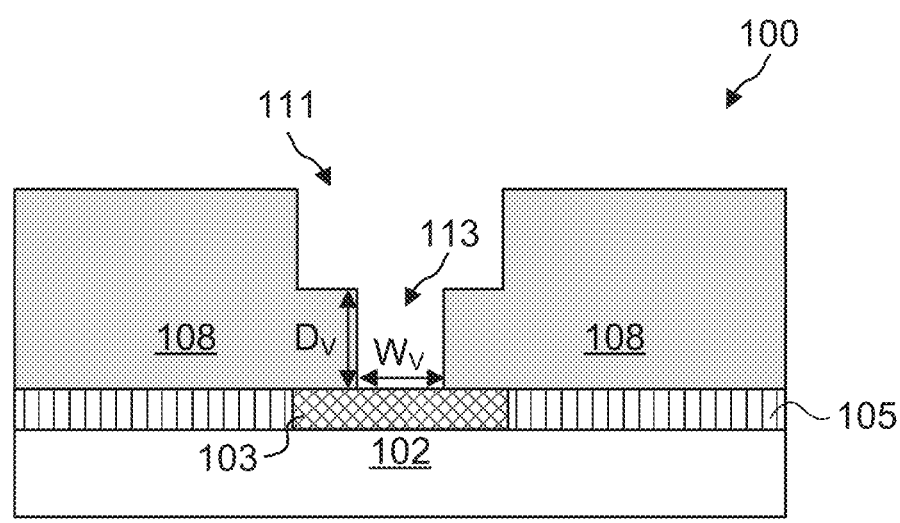
Figure 2A:
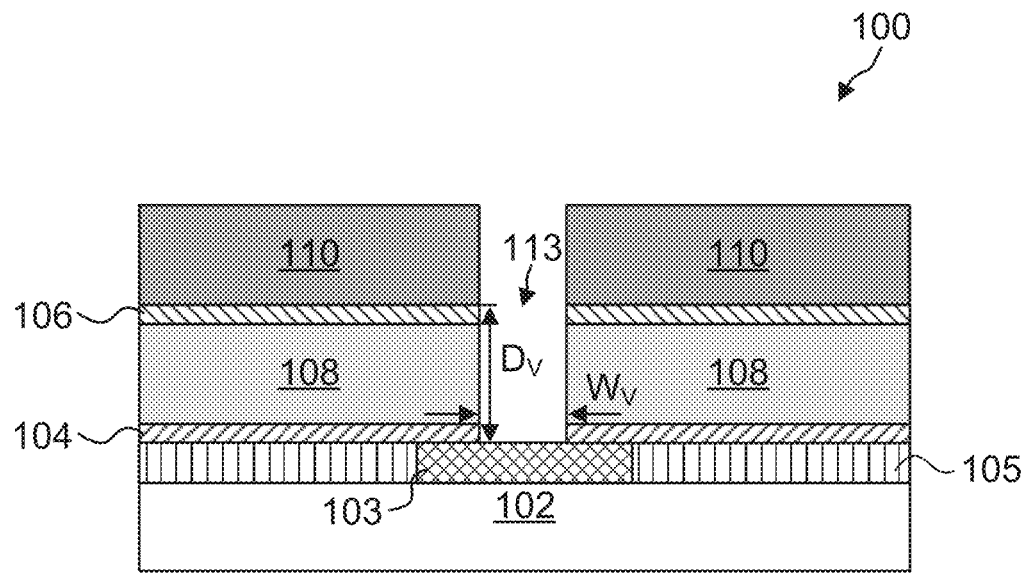
Figure 2B:
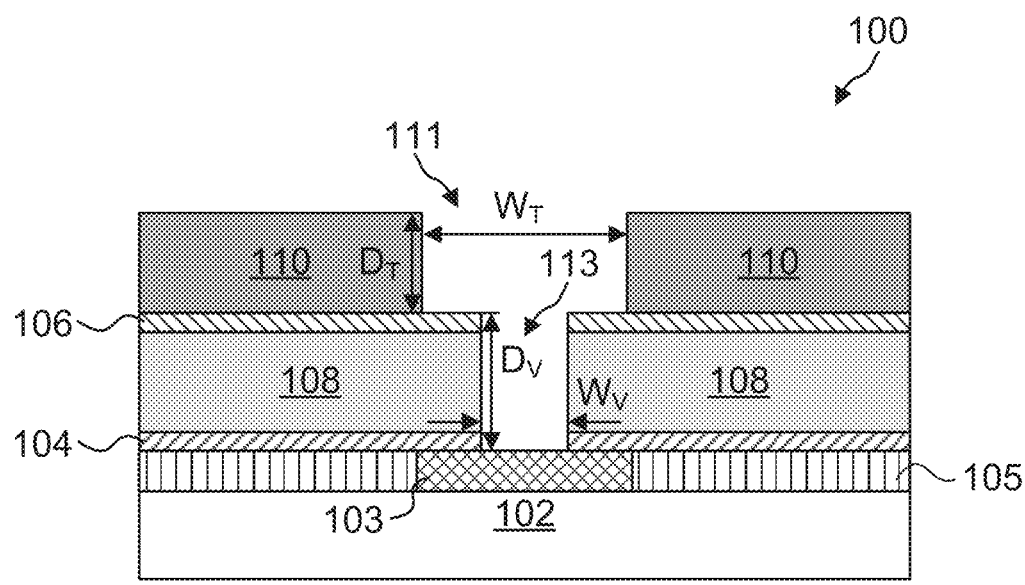
Figure 2C:
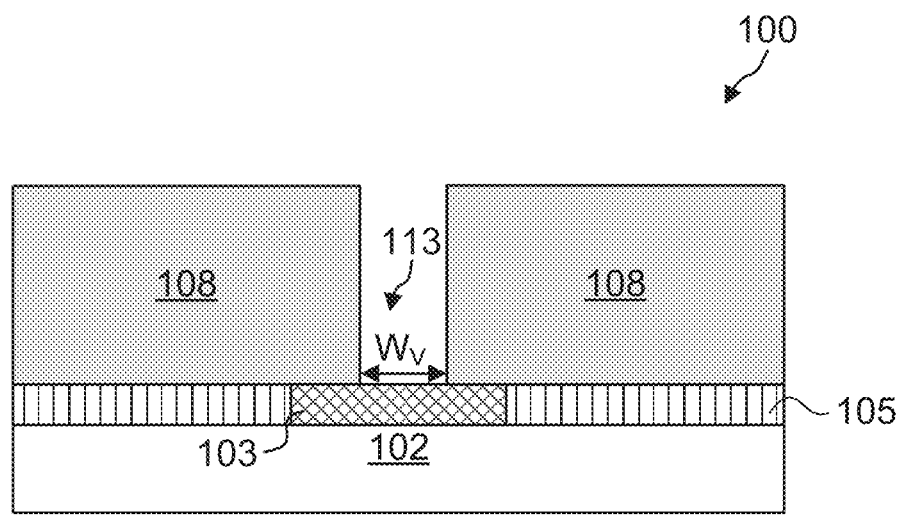
Figure 2D:
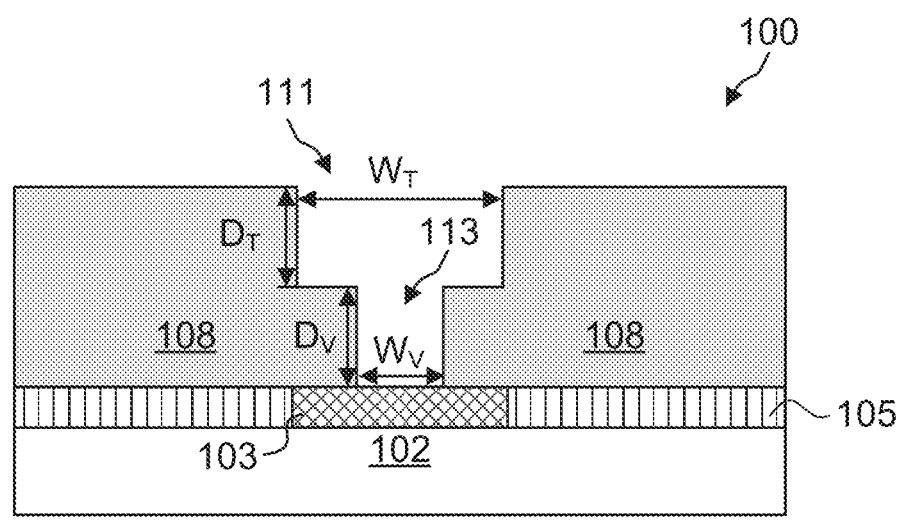
Figure 3:
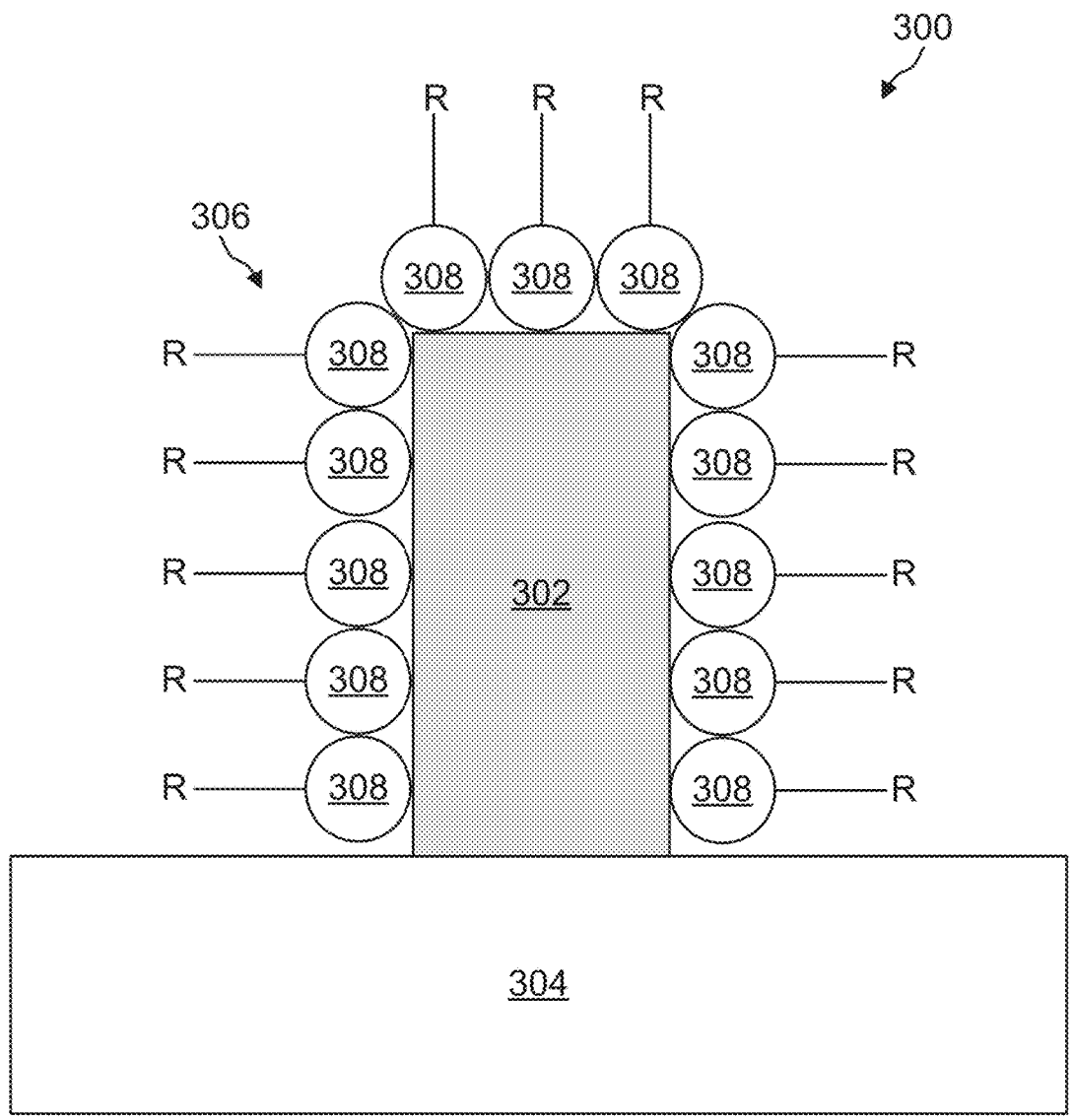
FIG. 3 is a representation of a SAM layer that is deposited on a semiconductor structure that includes a dielectric layer overlying a conductive layer, in accordance with some embodiments.
Figure 4A:
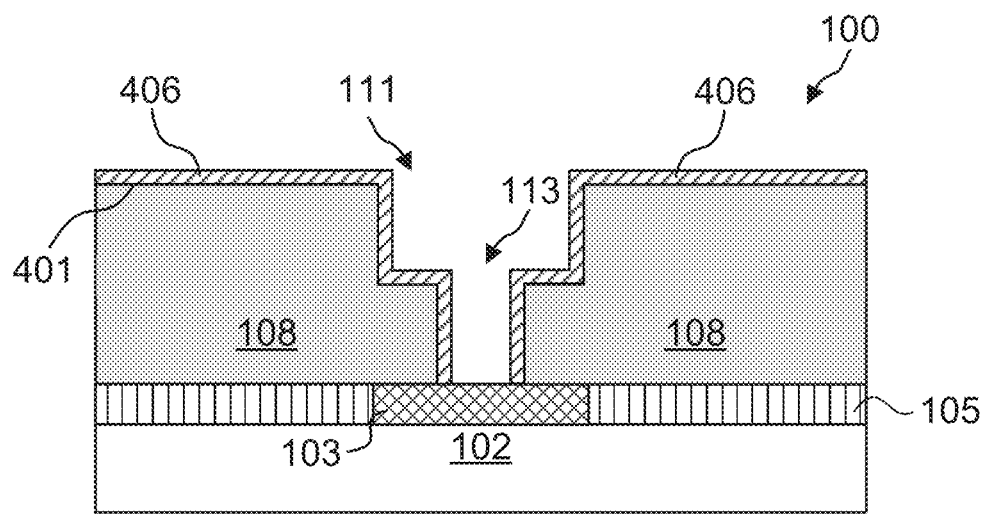
FIG. 4A is a cross-sectional view of a partially-formed semiconductor interconnect structure after deposition of a SAM layer, in accordance with some embodiments.
Figure 4B:
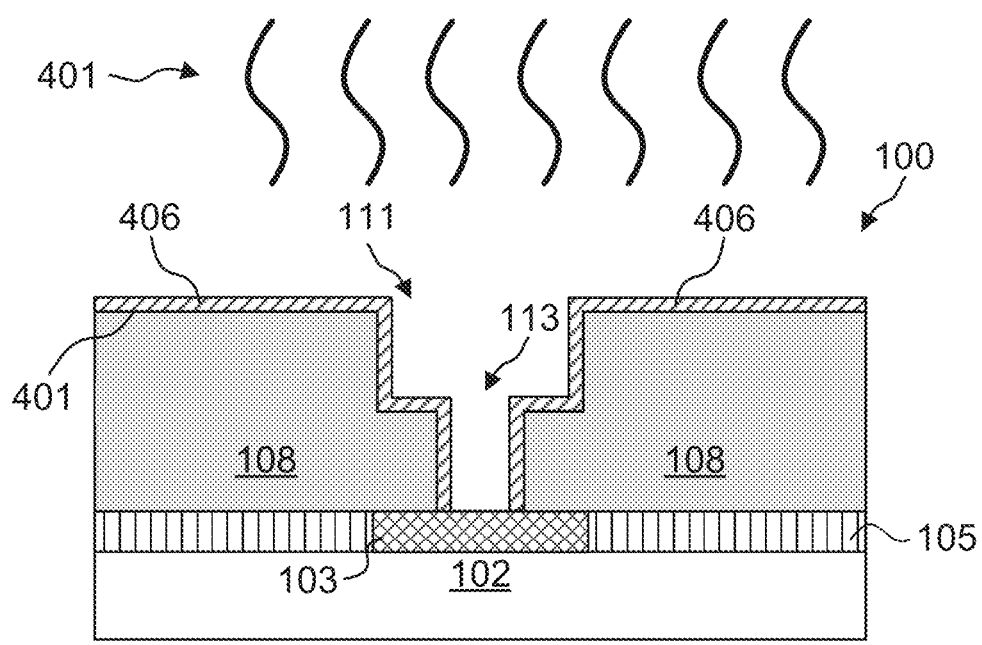
FIGS. 4B-4E are cross-sectional views of a partially-formed semiconductor interconnect structure during annealing processes, in accordance with some embodiments.
Figure 4C:
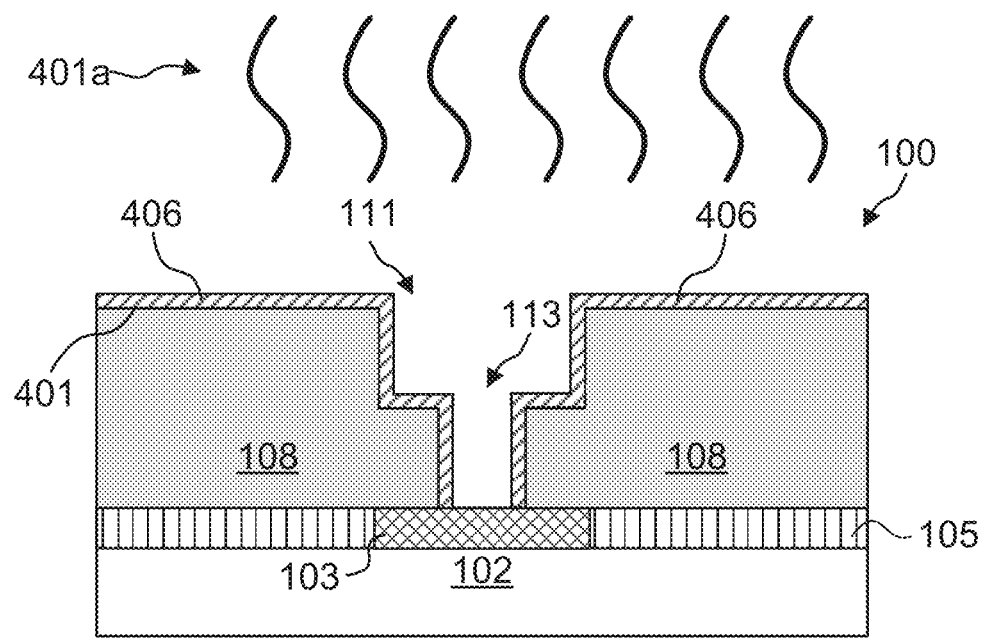
Figure 4D:
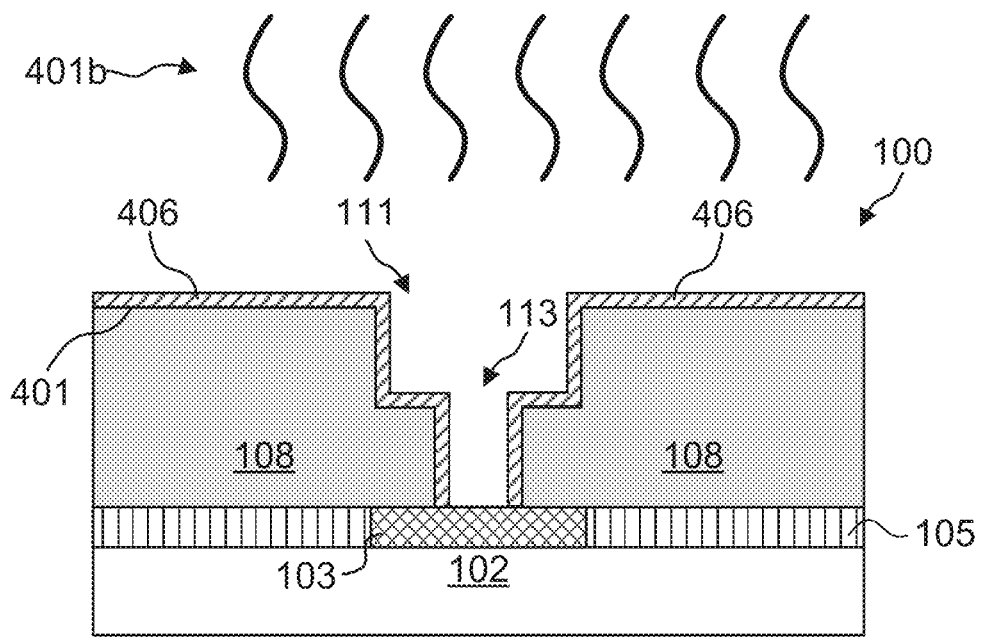
Figure 4E:
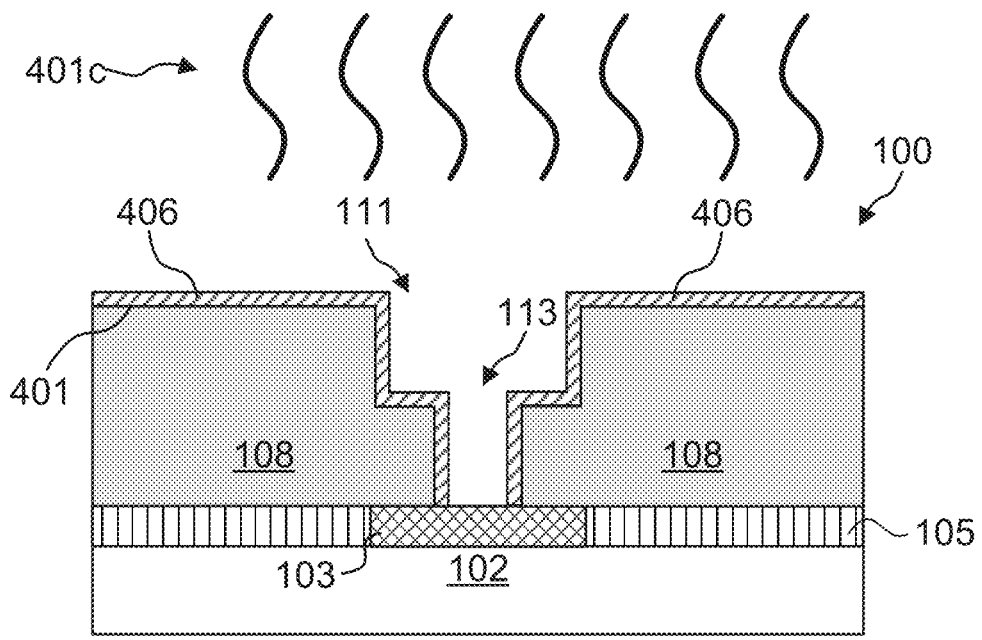
Figure 5:
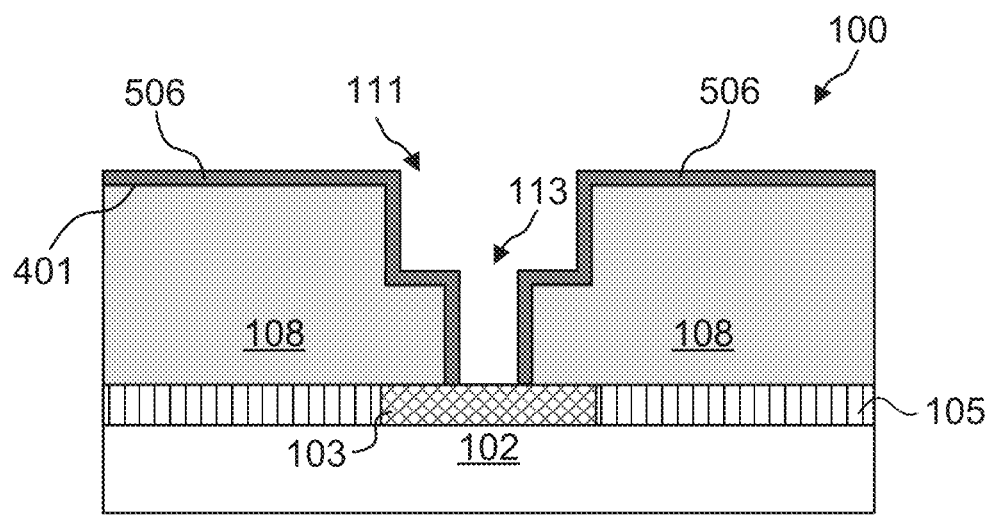
FIG. 5 is a cross-sectional view of a partially-formed semiconductor interconnect structure after annealing a SAM layer to form a graphene-based barrier layer, in accordance with some embodiments.
Figure 6:
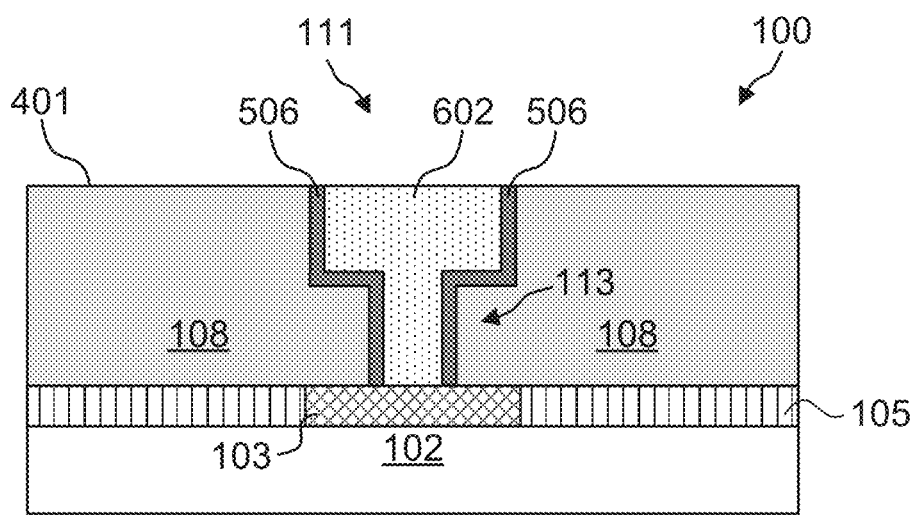
FIGS. 6-7 are cross-sectional views of a partially-formed semiconductor interconnect structure after deposition of conductive layers, in accordance with some embodiments.
Figure 7:
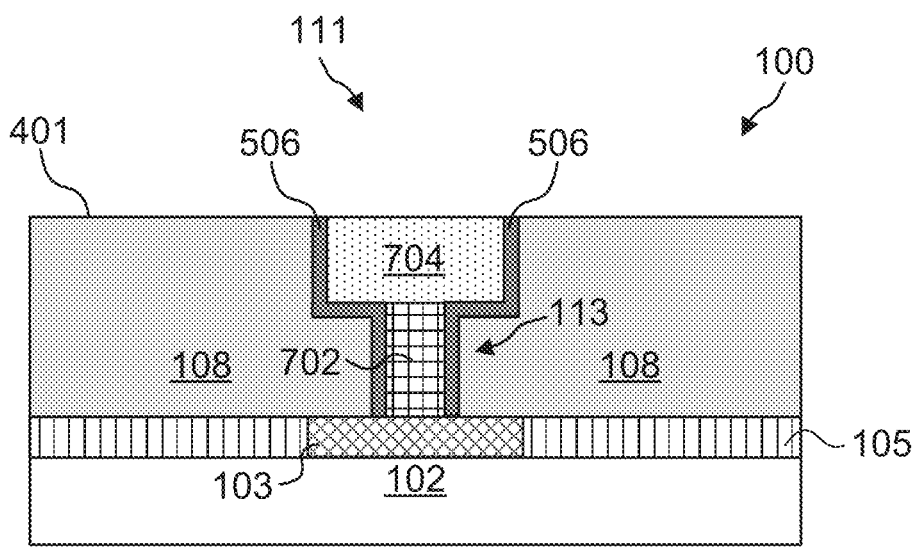

FIGS. 1A-7 provide various views of a semiconductor device fabrication process that illustrate the formation of trenches and vias in a partially-formed semiconductor interconnect structure, in accordance with some embodiments. More specifically, FIGS. 1A-1D illustrate a partially-formed semiconductor interconnect structure formed using a dual damascene process under a "trench first then via" order. FIGS. 2A-2D illustrate a partially-formed semiconductor interconnect structure formed using a dual damascene process under a "via first then trench" order. FIG. 3 illustrates a representation of a SAM layer deposited on a semiconductor structure that includes a dielectric layer overlying a conductive layer. FIG. 4A illustrates a partially-formed semiconductor interconnect structure after deposition of a SAM layer. FIG. 4B-4E illustrate partially-formed semiconductor interconnect structures during annealing processes. FIG. 5 illustrates a partially-formed semiconductor interconnect structure after annealing a SAM layer to form a graphene-based barrier layer. And FIGS. 6-7 illustrate a partially-formed semiconductor interconnect structure after deposition of conductive layers. The fabrication processes provided herein are exemplary, and alternative processes in accordance with this disclosure can be performed (though they are not shown in these figures).

FIGS. 1A-1D illustrate various views of a partially-formed semiconductor interconnect structure formed using a dual damascene process under a "trench first then via" order, according to some embodiments. More than one pair of via and trench can be formed in the semiconductor interconnect structure.

FIG. 1A is a cross-sectional view of a partially-fabricated semiconductor interconnect structure after the formation of trenches, in accordance with some embodiments of the present disclosure. Partially-fabricated semiconductor interconnect structure 100 can include a substrate 102, a conductive interconnection layer 103, a first etch stop layer 104, a dielectric structure 105, a second etch stop layer 106, a first dielectric layer 108, and a second dielectric layer 110. A trench 111 is formed in second dielectric layer 110. In some embodiments, semiconductor interconnect structure 100 can include capping layers, other etch stop layers, other dielectric layers, and/or other suitable materials.

Substrate 102 can be a silicon substrate, according to some embodiments. In some embodiments, substrate 102 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including silicon germanium (SiGe); or (iv) combinations thereof. In some embodiments, substrate 102 can be a semiconductor on insulator (SOI). In some embodiments, substrate 102 can be an epitaxial material.

Conductive interconnection layer 103 can be an active region of a semiconductor device or a conductive layer embedded in substrate 102. In some embodiments, conductive interconnection layer 103 can be embedded in a dielectric structure 105. In some embodiments, conductive interconnection layer 103 can be a metal layer providing electrical connections to integrated circuits and devices. The composition of conductive interconnection layer 103 can include suitable materials such as, for example, silver (Ag), aluminum (Al), gold (Au), Cu, ruthenium (Ru), cobalt (Co), nickel (Ni), W, manganese (Mn), molybdenum (Mo), cobalt tungsten (CoW), cobalt tungsten phosphorous (CoWP), other suitable materials, and/or combinations thereof. In some embodiments, conductive interconnection layer 103 can include a processed integrated circuit wafer containing such as, for example, a plurality of transistors configured to be complementary metal-oxide-semiconductor (CMOS) circuits. These circuits can include logic, analog, radio-frequency (RF) parts made out of a variety of transistors, field-effect transistors (FETs), capacitors, resistors, and interconnections, and are not shown in FIG. 1A for simplicity.

In some embodiments, first etch stop layer 104 is formed on dielectric structure 105 and can be used to prevent the etching of dielectric structure 105 and conductive interconnection layer 103. The composition of first etch stop layer 104 can be silicon nitride. Other exemplary compositions include silicon oxynitride ($SiO_xN_y$), other suitable materials, and/or combinations thereof. The deposition of first etch stop layer 104 can be done by any suitable processes such as, for example, chemical vapor deposition (CVD), physical vapor deposition (PVD), atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, other suitable methods, and/or combinations thereof.

In some embodiments, dielectric structure 105 can be made of a low-k dielectric material. In some embodiments, dielectric structure 105 can be formed of any suitable dielectric material such as, for example, silicon oxide ($SiO_x$), organosilicate ($SiO_xC_yH_z$), silicon oxycarbide ($SiO_xC_y$), silicon carbide ($SiC_x$), silicon nitride ($SiN_x$), and/or other suitable dielectric material. The deposition of dielectric structure 105 can be done by any suitable processes such as, for example, CVD, PVD, ALD, MBE, HDPCVD, MOCVD, RPCVD, PECVD, other suitable methods, and/or combinations thereof.

In some embodiments, second etch stop layer 106 is formed on first dielectric layer 108 and can be used to provide an etch stop when forming trench 111 and prevent the etching of first dielectric layer 108. The composition of second etch stop layer 106 can be similar to or different from first etch stop layer 104. For example, second etch stop layer 106 can be silicon nitride, silicon oxynitride, and/or other suitable materials. The deposition of second etch stop layer 106 can be done by any suitable processes such as, for example, CVD, PVD, ALD, MBE, HDPCVD, MOCVD, RPCVD, PECVD, plating, other suitable methods, and/or combinations thereof.

First dielectric layer 108 is made of a dielectric material and can be formed of silicon oxide, spin-on-glass, silicon nitride, silicon oxynitride, silicon oxycarbide, silicon carbide, fluorine-doped silicate glass (FSG), organosilicate, low-k dielectric material, and/or other suitable insulating material. The dielectric value of first dielectric layer 108 can be in a range of about 1 to about 4. The deposition of first dielectric layer 108 can be done by any suitable processes such as, for example, CVD, PVD, ALD, MBE, HDPCVD, MOCVD, RPCVD, PECVD, other suitable methods, and/or combinations thereof. In some embodiments, the thickness of first dielectric layer 108 can be in a range of about 100 angstroms to about 2000 angstroms.

Second dielectric layer 110 is made of a dielectric material and can be similar to or different from first dielectric layer 108. For example, second dielectric layer 110 can be formed of silicon oxide, spin-on-glass, silicon nitride, silicon oxynitride, silicon oxycarbide, silicon carbide, FSG, organosilicate, low-k dielectric material, and/or other suitable insulating material. The dielectric value of second dielectric layer 110 can be in a range of about 1 to about 4. Second dielectric layer 110 can deposited by any suitable processes such as, for example, CVD, PVD, ALD, MBE, HDPCVD, MOCVD, RPCVD, PECVD, other suitable methods, and/or combinations thereof. In some embodiments, the thickness $D_T$ of second dielectric layer 110 can be in a range of about 50 angstroms to about 1000 angstroms.

Trench 111 is an opening that extends vertically through second dielectric layer 110 and can be fabricated using suitable processes including patterning and etching processes. For example, trench 111 can be formed in second dielectric layer 110 using a masking layer that protects regions of second dielectric layer 110 during the etching process. Composition of the masking layer can include a photoresist, a hard mask, and/or other suitable materials. Other exemplary compositions include silicon nitride, silicon oxide, and/or other suitable materials. The patterning process can include forming the masking layer over second dielectric layer 110, exposing the resist to a pattern, performing post-exposure bake processes, and developing the resist to form a masking element consisting of the photoresist. The masking element can then be used to protect regions of second dielectric layer 110 while one or more etching processes forms trenches in second dielectric layer 110. Trenches 111 can be formed using a dry etching process such as, for example, a reactive ion etch (RIE) and/or other suitable processes. In some embodiments, trenches 111 can be formed using a wet chemical etching process. Numerous other methods to form trenches 111 in second dielectric layer 110 may be suitable and one or more etching processes may be needed. The etching process continues until the underlying second etch stop layer 106 is exposed, and second etch stop layer 106 that is formed on first dielectric layer 108 can be used to provide an etch stop for the etching process. In some embodiments, the width $W_T$ of trench 111 can be in a range of about 50 angstroms to about 1000 angstroms.

FIG. 1B is a cross-sectional view of a partially-fabricated semiconductor interconnect structure after the formation of vias, in accordance with some embodiments of the present disclosure. Via 113 is an opening under trench 111 and extends vertically through first dielectric layer 108. Via 113 can be fabricated using suitable processes including patterning and etching processes, for example, via 113 can be formed in portions of first dielectric layer 108 that are exposed by trench 111 using a masking layer that protects regions of first dielectric layer 108 during the etching process. Via 113 can have a lateral dimension that is less than that of trench 111. Composition of the masking layer can include a photoresist, a hard mask, and/or other suitable materials. Exemplary compositions of hard masks can include silicon nitride, silicon oxide, and/or other suitable materials. The patterning process can include forming the masking layer over second dielectric layer 110 and second etch stop layer 106, exposing the resist to a pattern, performing post-exposure bake processes, and developing the resist to form a masking element consisting of the photoresist. The masking element can then be used to protect regions of first dielectric layer 108 while one or more etching processes form via 113 in first dielectric layer 108. The etching process can also remove first and second etch stop layer 104 and 106, exposing underlying conductive interconnection layer 103. The etching process can be a dry etching process such as, for example, an RIE and/or other suitable processes. In some embodiments, via 113 can be formed using a wet chemical etching process. Numerous other methods to form via 113 in first dielectric layer 108 may be suitable and one or more etching processes may be needed. The etching process continues until the underlying conductive interconnection layer 103 is exposed. In some embodiments, the width $W_V$ of via 113 can be in a range of about 50 angstroms to about 1000 angstroms.

With reference to FIGS. 1C-1D, trenches 111 and vias 113 can be formed in semiconductor interconnect structure 100 without using first and second etch stop layers 104 and 106, in accordance with some embodiments. Further, the composition of respective first and second dielectric layers 108 and 110 can be similar and for simplicity purposes are illustrated as a single first dielectric layer 108, in accordance to some embodiments.

FIG. 1C is a cross-sectional view of a partially-fabricated semiconductor interconnect structure after the formation of trenches, in accordance with some embodiments of the present disclosure. Similar to the semiconductor interconnect structure described with references to FIGS. 1A-1B, first dielectric layer 108 is formed over substrate 102 and conductive interconnection layer 103. First dielectric layer 108 is made of a dielectric material and can be formed of silicon oxide, spin-on-glass, silicon nitride, silicon oxynitride, FSG, a low-k dielectric material, and/or other suitable insulating material. The deposition of first dielectric layer 108 can be done by any suitable processes such as, for example, CVD, PVD, ALD, MBE, HDPCVD, MOCVD, RPCVD, PECVD, other suitable methods, and/or combinations thereof. In some embodiments, the thickness of first dielectric layer 108 can be in a range of about 100 angstroms to about 2000 angstroms.

Trench 111 can be fabricated using suitable processes including patterning and etching processes. For example, trench 111 can be formed in first dielectric layer 108 using a masking layer that protects regions of first dielectric layer 108 during the etching process. Composition of the masking layer can include a photoresist, a hard mask, and/or other suitable materials. Other exemplary compositions include silicon nitride, silicon oxide, and/or other suitable materials. The patterning process can include forming the masking layer over first dielectric layer 108, exposing the resist to a pattern, performing post-exposure bake processes, and developing the resist to form a masking element consisting of the photoresist. The masking element can then be used to protect regions of first dielectric layer 108 during the etching process. In some embodiments, the width $W_T$ of trench 111 can be in a range of about 50 angstroms to about 10000 angstroms. Trench 111 can be formed using a dry etching process such as, for example, an RIE process and/or other suitable processes. In some embodiments, trench 111 can be formed using a wet chemical etching process. The etching process continues until a nominal depth of trench 111 has been reached such as, for example, a depth $D_T$ can be in a range of about 50 angstroms to about 1000 angstroms. The depths of trench 111 can be controlled by tuning etching conditions such as, for example, etching time, chamber pressure, gas flow rate, plasma power, and/or voltage biases, or other suitable parameters.

FIG. 1D is a cross-sectional view of a partially-fabricated semiconductor interconnect structure after the formation of vias, in accordance with some embodiments of the present disclosure. Via 113 can be fabricated using suitable processes including patterning and etching processes. For example, via 113 can be formed in first dielectric layer 108 using a masking layer that protects regions of first dielectric layer 108 during the etching process. Composition of the masking layer can include a photoresist, a hard mask, and/or other suitable materials. Other exemplary compositions include silicon nitride, silicon oxide, and/or other suitable materials. The patterning process can include forming the masking layer over first dielectric layer 108, exposing the resist to a pattern, performing post-exposure bake processes, and developing the resist to form a masking element consisting of the photoresist. The masking element can then be used to protect regions of first dielectric layer 108 while one or more etching processes form via 113 in first dielectric layer 108. The etching process continues until underlying conductive interconnection layer 103 is exposed. The etching process can be a dry etching process such as, for example, an RIE process and/or other suitable processes. In some embodiments, via 113 can be formed using a wet chemical etching process. In some embodiments, the width $W_V$ of via 113 can be in a range of about 50 angstroms to about 5000 angstroms, and the depth $D_V$ can be in a range of about 50 angstroms to about 1000 angstroms.

FIGS. 2A-2D illustrate various views of a partially-formed semiconductor interconnect structure formed using a dual damascene process under a "via first then trench" order. More than one pair of via and trench can be formed in the semiconductor interconnect structure.

FIG. 2A is a cross-sectional view of a partially-fabricated semiconductor interconnect structure after the formation of trenches, in accordance with some embodiments of the present disclosure. Semiconductor interconnect structure 100 can include substrate 102, conductive interconnection layer 103, first etch stop layer 104, second etch stop layer 106, first dielectric layer 108, and second dielectric layer 110. To form via 113 in first dielectric layer 108, a portion of second dielectric layer 110 would also be removed. In some embodiments, semiconductor interconnect structure 100 can include capping layers, other etch stop layers, other dielectric layers, and/or other suitable materials. Substrate 102, conductive interconnection layer 103, first etch stop layer 104, second etch stop layer 106, first dielectric layer 108, and second dielectric layer 110 are described above with respect to FIGS. 1A-1D.

Via 113 is an opening that extends vertically through first dielectric layer 108, and can fabricated be using suitable processes including patterning and etching processes. Portions of both first and second dielectric layer 108 and 110 will be etched during this process as portions of second dielectric layer 110 need to be removed in order to access first dielectric layer 108. A masking layer is formed over second dielectric layer 110 and patterned to protect regions of second dielectric layer 110 during the etching process, and the pattern can be transferred to first dielectric layer 108 through the etching process. Composition of the masking layer can include a photoresist, a hard mask, and/or other suitable materials. Other exemplary compositions include silicon nitride, silicon oxide, and/or other suitable materials. The patterning process can include forming the masking layer over second dielectric layer 110, exposing the resist to a pattern, performing post-exposure bake processes, and developing the resist to form a masking element consisting of the photoresist. The masking element can then be used to protect regions of second dielectric layer 110 while one or more etching processes remove exposed portions of second dielectric layer 110 and form vias in first dielectric layer 108. Via 113 can be formed using a dry etching process such as, for example, an RIE process and/or other suitable processes. In some embodiments, via 113 can be formed using a wet chemical etching process. Numerous other methods to form via 113 in first dielectric layer 108 can be suitable, and one or more etching processes may be needed. The etching process continues until conductive interconnection layer 103 is exposed. During the etching process, first and second etch stop layer 104 and 106 can be removed using suitable processes such as, for example, dry etching, wet chemical etching, and/or other suitable processes. In some embodiments, the width $W_V$ of via 113 can be in a range of about 50 angstroms to about 5000 angstroms.

FIG. 2B is a cross-sectional view of a partially-fabricated semiconductor interconnect structure after the formation of trenches, in accordance with some embodiments of the present disclosure. Trench 111 is an opening that extends vertically through second dielectric layer 110. Trench 111 can be formed in second dielectric layer 110 and over via 113 using suitable processes including patterning and etching processes. For example, trench 111 can be formed in second dielectric layer 110 using a masking layer that protects regions of second dielectric layer 110 during the etching process. Composition of the masking layer can include a photoresist, a hard mask, and/or other suitable materials. Other exemplary compositions include silicon nitride, silicon oxide, and/or other suitable materials. The patterning process can include forming the masking layer over second etch stop layer 106, exposing the resist to a pattern, performing post-exposure bake processes, and developing the resist to form a masking element consisting of the photoresist. The masking element can then be used to protect regions of first dielectric layer 108 while one or more etching processes form via 113 in first dielectric layer 108. The etching process can also remove first and second etch stop layer 104 and 106, exposing underlying conductive interconnection layer 103. The etching process can be a thy etching process such as, for example, an RIE process and/or other suitable processes. In some embodiments, via 113 can be formed using a wet chemical etching process. Numerous other methods to form via 113 in first dielectric layer 108 may be suitable and one or more etching processes may be needed. The etching process continues until the underlying conductive interconnection layer 103 is exposed. In some embodiments, the width $W_T$ of trench 111 can be in a range of about 50 angstroms to about 10000 angstroms.

With reference to FIGS. 2C-2D, trenches 111 and vias 113 can be formed in semiconnect interconnect structure 100 without using first and second etch stop layers 104 and 106, in accordance with some embodiments. Further, the composition of respective first and second dielectric layers 108 and 110 can be similar and illustrated as a single first dielectric layer 108 for simplicity, in accordance to some embodiments.

FIG. 2C is a cross-sectional view of a partially-fabricated semiconductor interconnect structure after the formation of trenches, in accordance with some embodiments of the present disclosure. Similar to the semiconductor interconnect structure described with references to FIGS. 2A-2B, first dielectric layer 108 is formed over substrate 102 and conductive interconnection layer 103. Via 113 can be fabricated using suitable processes including patterning and etching processes. For example, via 113 can be formed in first dielectric layer 108 using a masking layer that protects regions of first dielectric layer 108 during the etching process. Composition of the masking layer can include a photoresist, a hard mask, and/or other suitable materials. Other exemplary compositions include silicon nitride, silicon oxide, and/or other suitable materials. The patterning process can include forming the masking layer over first dielectric layer 108, exposing the resist to a pattern, performing post-exposure bake processes, and developing the resist to form a masking element consisting of the photoresist. The masking element can then be used to protect regions of first dielectric layer 108 during the etching process. In some embodiments, the width $W_V$ of via 113 can be in a range of about 50 angstroms to about 5000 angstroms. Via 113 can be formed using a dry etching process such as, for example, an RIE process and/or other suitable processes. In some embodiments, via 113 can be formed using a wet chemical etching process. The etching process continues until conductive interconnection layer 103 is exposed.

FIG. 2D is a cross-sectional view of a partially-fabricated semiconductor interconnect structure after the formation of trenches, in accordance with some embodiments of the present disclosure. Trench 111 can be fabricated using suitable processes including patterning and etching processes. For example, trench 111 can be formed in first dielectric layer 108 and over via 113 using a masking layer that protects regions of first dielectric layer 108 during the etching process. Composition of the masking layer can include a photoresist, a hard mask, and/or other suitable materials. Other exemplary compositions include silicon nitride, silicon oxide, and/or other suitable materials. The patterning process can include forming the masking layer over first dielectric layer 108, exposing the resist to a pattern, performing post-exposure bake processes, and developing the resist to form a masking element consisting of the photoresist. The masking element can then be used to protect regions of first dielectric layer 108 while one or more etching processes form trench 111 in first dielectric layer 108. The etching process continues until a nominal depth of trench 111 has been reached such as, for example, a depth $D_T$ can be in a range of about 100 angstroms to about 1000 angstroms. The depth $D_T$ of trench 111 can be controlled by tuning etching conditions such as, for example, etching time, chamber pressure, gas flow rate, plasma power, and/or voltage biases, or other suitable parameters. The etching process can be a dry etching process such as, for example, an RIE process and/or other suitable processes. In some embodiments, trench 111 can be formed using a wet chemical etching process. In some embodiments, the width $W_T$ of trench 111 can be in a range of about 100 angstroms to about 10000 angstroms.

Before establishing electrical connection in the partially-fabricated semiconductor interconnect structure described above with references to FIGS. 1B and 1D or FIGS. 2B and 2D, a barrier layer can be formed prior to the deposition of a conductive material in trench 111 and via 113. In some embodiments, graphene-based barrier layers can be formed using a SAM layer on select surfaces of the semiconductor interconnect structures with nominal thickness.

Using the structures described above with references to FIGS. 1B and 1D or FIGS. 2B and 2D, fabrication processes in accordance with embodiments of this disclosure can incorporate graphene-based barrier layers into semiconductor interconnect structures using SAM layers. The structures described herein are exemplary, and graphene-based barrier layers can be incorporated in any suitable semiconductor structures.

Graphene formed by SAM layers can be an effective barrier layer for preventing metal diffusion or oxidation in vias or metal interconnect structures. In addition, minimal body thickness made possible by thin layered graphene-based materials can allow further reduction in device dimension without sacrificing device performance. Especially for aggressive (e.g., sub 7 nm or sub 5 nm and beyond) design rules, the implementation of suitable graphene-based materials as barrier layers can yield further scaled, high-performance low-power devices.

A SAM layer is an organized layer of molecules that can be tailored such that one end of the molecule, a "head group," shows an affinity for dielectric surfaces and an aversion for metal surfaces. The head group is connected to an alkyl chain in which a tail or "terminal end" can be functionalized, for example, to vary wetting and interfacial properties. The head group is connected to a "terminal end" (a functional group) through a chain. In some embodiments, affinity and aversion characteristics can be achieved for a wide range of surfaces by choosing different compound types of head groups.

FIG. 3 illustrates a representation of a SAM layer 306 deposited on a semiconductor structure 300 that includes a dielectric layer 302 overlying a conductive layer 304. In some embodiments, SAM layer 306 includes an organized layer of molecules in which one end of the molecule, the head group 308, shows a specific affinity for dielectric layers and an aversion for metal surfaces. In some embodiments, head group 308 can be selected to show different affinity or aversion for different surfaces, depending on the needs and device designs. Various features in FIG. 3, such as semiconductor structure 300 and SAM layer 306, are not drawn to scale. In fact, the dimensions of these various features are arbitrarily increased or reduced for clarity of illustration and discussion.

The selection of head group 308 can depend on the application of the SAM layer. In some embodiments, the compound types of head group 308 can be selected based on the affinity or aversion to the utilized material. In some embodiments, the compound types of head group 308 is selected such that head group 308 shows a specific affinity for dielectric surfaces and an aversion for metal surfaces. For example, dielectric layer 302 can be a dielectric layer formed using dielectric materials such as, for example, silicon oxide, spin-on-glass, silicon nitride, silicon oxynitride, silicon oxycarbide, silicon carbide, FSG, organosilicate, low-k dielectric material, and/or other suitable insulating material. Conductive layer 304 can be a conductive layer formed using metals such as, for example, Ag, Al, Au, Cu, Ru, Co, Ni, W, Mn, Mo, CoW, CoWP, other suitable materials, and/or combinations thereof. The material selections and structures described herein are exemplary, and that dielectric layer 302 and conductive layer 304 can include, for example, planar surfaces or curved surfaces, such as nanoparticles.

As shown in FIG. 3, the composition of head group 308 can be selected such that it displays affinity for dielectric surfaces and aversion for metal surfaces. Due to surface selectivity of head group 308, SAM layer 306 can be formed on exposed surfaces of dielectric layer 302 and not on conductive layer 304. For example, head group 308 can be attracted to the dangling OH bonds of the surfaces of dielectric layer 302 and form covalent bonds through condensation reactions, in accordance with some embodiments. Therefore, the surface selectivity of SAM layer 306 provides the benefit that SAM layers can be selectively deposited on desired surfaces, and in turn provides the benefit of forming graphene on these desired surfaces. SAM layer 306 can be deposited using suitable processes such as, for example, wet chemical solution, spin-on, CVD, PECVD, ALD, plasma-enhanced ALD (PEALD), and/or other suitable processes. In some embodiments, the processing temperature of depositing SAM layer 306 can be in a range of about room temperature to about 1000° C. In some embodiments, the processing temperature can be in a range of about room temperature to about 450° C. In some embodiments, the deposited SAM layer 306 can be dried using dry-up processes such as, for example, high-speed spinning, isopropanol alcohol rinse, other suitable drying processes, and/or combinations thereof.

The composition of head group 308 can include an organosulfur compound such as, for example, din-alkyl sulfide, di-n-alkyl disulfides, thiophenols, mercaptopyridines, mercaptoanilines, thiophenes, cysteines, xanthates, thiocarbaminates, thiocarbamates, thioureas, mercaptoimidazoles, alkanethiols, alkaneselenols, and/or other suitable materials. In some embodiments, the head group 308 can contain thiol, chloride, fluoride, and/or other suitable materials.

In some embodiments, terminal ends 'R' can be functional groups selected based on device needs. For example, the functional groups of terminal end R can be alkyl groups $(C_xH_y)$ which can form a graphene layer through an annealing process. In some embodiments, terminal end R can be biphenyl molecules, and the annealing process can induce graphitization of SAM layer 306 to transform carbon rings of the biphenyl molecules into a graphene sheet. The annealing temperature to induce graphitization can be in a range of about 200° C. to about 1400° C. In some embodiment, the annealing temperature can be in a range of about 200° C. to about 450° C. In some embodiments, SAM layers can be silane-based materials with different molecular length and functional groups.

A nominal thickness of the graphene layer can be achieved by selecting different alkyl groups of the SAM layer. Different alkyl groups can have different alkyl chain lengths such as, for example, the carbon chain length $(C—C)^n$ of the alkyl chain can be different between alkyl groups. Examples of alkyl groups include, for example, $C_3H_7$, silane with $C_3H_6$ composition, other suitable alkyl groups, and/or combinations thereof. In another example, (3-propyl)-trimethoxysilane with different terminal function groups can be used. A specific alkyl group can be selected from various alkyl groups to achieve a nominal SAM layer thickness, and in turn result in a nominal graphene layer thickness. For example, longer alkyl chain lengths can be chosen to result in a graphene layer of greater thickness such as 80 angstroms, and shorter alkyl chain lengths can be chosen to result in a graphene layer of lower thickness such as 10 angstroms. The thicknesses of 80 angstroms and 10 angstroms nm are merely examples, and in some embodiments the thicknesses are not constrained to these examples. For example, by choosing nominal alkyl chain lengths, the SAM layer and graphene layer thicknesses can be in a range of about 1 angstrom to about 100 angstroms. In some embodiments, the graphene layer has a thickness less than 10 angstroms and greater than 0. Thus, by tailoring the lengths of the alkyl chains used in this process, a wide range of graphene layer thickness can be achieved.

FIGS. 4A-5 provide various views of a fabrication process of a partially-fabricated semiconductor interconnect structure that illustrate the formation of graphene-based barrier layers using SAM layers. The fabrication process provided herein is exemplary, and alternative processes in accordance with this disclosure can be performed that are not shown in these figures.

FIG. 4A is a cross-sectional view of a partially-fabricated semiconductor interconnect structure 100 after depositing a SAM layer, in accordance with some embodiments of the present disclosure. As shown in FIG. 4A, a SAM layer 406 is deposited over exposed surfaces of the partially-fabricated semiconductor structure 100 described with references to FIGS. 1D and 2D. The head group of SAM layer 406 is selected such that SAM layer 406 displays an affinity for dielectric surfaces. Therefore, SAM layer 406 can be formed on the exposed surfaces of dielectric layer 108 such as, for example, the horizontal plane 401 of first dielectric layer 108 and the exposed surfaces in trench 111 and via 113. In some embodiments, the head group of SAM layer 406 is selected such that SAM layer 406 also displays an affinity for surfaces of etch stop layers such as, for example, etch stop layers 104 and 106. Therefore, SAM layer 406 can also be formed on exposed surfaces of etch stop layer 106 as described with reference to FIGS. 1B and 2B. Further, the head group of SAM layer 406 can be selected to have an aversion for metal surfaces, thus SAM layer 406 is not formed on the exposed metal surface of conductive interconnection layer 103. A nominal thickness of SAM layer 406 can be achieved by choosing the corresponding alkyl group, and the thickness can be in a range of about 1 angstrom to about 100 angstroms. SAM layer 406 can be deposited using any suitable processes such as, for example, wet chemical solution, spin-on, CVD, PECVD, ALD, plasma-enhanced ALD (PEALD), and/or other suitable processes. The processing temperature of SAM layer 406 can be in a range of about room temperature to about 1000° C.

FIG. 4B is a cross-sectional view of a partially-fabricated semiconductor interconnect structure 100 during an annealing process, in accordance with some embodiments of the present disclosure. The annealing temperature to induce graphitization can be in a range of about 200° C. to about 1400° C. In some embodiments, depending on the thermal budget of semiconductor structure 100 and/or other embedded devices, the annealing temperature can be between about 200° C. to about 450° C. An annealing process 401 is used to provide sufficient thermal energy to induce a thermal transition of SAM layer to the graphene barrier layer and can use any suitable annealing methods such as, for example, plasma heating, infra-red heating, lamp heating, rapid annealing, traditional baking, other suitable annealing methods, and/or combinations thereof. As shown in FIG. 4B, annealing process 401 can be a single-step annealing process, in accordance with some embodiments. In some embodiments, the temperature for the single-step annealing process can be about 400° C. In some embodiments, the temperature can be any other suitable temperatures such as, for example, 200° C., 300° C., other suitable temperatures, and/or combination thereof, in accordance with some embodiments. Annealing process 401 can also be done through multiple annealing steps at various temperatures, in accordance with some embodiments. For example, the multiple annealing steps can include annealing steps performed at temperatures of about 200° C., 300° C., 400° C., or any other suitable temperatures. In some embodiments, annealing process 401 can be a multi-step annealing process that includes pre-heating steps, stable heating steps, cooling steps, other suitable steps, and/or combinations thereof. For example, annealing process 401 can include annealing steps 401(a)-(c), as shown in FIGS. 4C-4E respectively. For example, as shown in FIG. 4C, annealing step 401(a) can be a pre-heating step where the semiconductor interconnect structure 100 is heated from room temperature to a stable temperature. The rate of temperature increase can depend on fabrication requirements such as device thermal budget and thermal tolerance. As shown in FIG. 4D, annealing step 401(b) can be a stable heating step which can be performed at about 400° C. for about 600 s. The temperature and time of the stable heating step depends on the thermal energy of inducing thermal transition of SAM layer into graphene layer and can vary depending on the structure and composition of the SAM layer. As shown in FIG. 4E, annealing step 401(c) can be a cooling step where semiconductor interconnect structure 100 is cooled to a desired temperature such as, for example, room temperature. In addition, annealing process can be performed for different periods of time. For example, each step of the multi-step annealing process can be performed for the same or different amount of time. For example, each annealing step in a three-step anneal process can be performed for about 300 s, 600 s, and 60 s, respectively. The annealing time for a single-step annealing process can be performed for any suitable amount of time such as, for example, 600 s, in accordance with some embodiments. In some embodiments, an annealing time of 30 min can be applied to allow thermal equilibration.

FIG. 5 is a cross-sectional view of a partially-fabricated semiconductor interconnect structure 100 after annealing a SAM layer to form a graphene-based barrier layer, in accordance with some embodiments of the present disclosure. In some embodiments, the terminal end R of SAM layer 406 can be functional groups that can form graphene or graphene-based barrier layers through annealing processes. For example, the functional groups of terminal end R can be alkyl groups ($C_xH_y$) which can form a graphene layer through an annealing process. In some embodiments, terminal end R can be biphenyl molecules, and the annealing process can induce graphitization of SAM layer 406 and transform carbon rings of the biphenyl molecules to form graphene barrier layer 506. In some embodiments, SAM layers can be silane-based materials with different molecular length and functional groups. In some embodiments, the thickness of graphene barrier layer 506 can be tailored by selecting a corresponding alkyl group for the terminal end R of SAM layer 406. For example, the graphene barrier layer 506 can have a thickness less than 10 angstroms and greater than 0, in accordance with some embodiments.

FIG. 6 is a cross-sectional view of a partially-fabricated semiconductor interconnect structure after depositing a conductive layer in the trench and via areas, in accordance with some embodiments of the present disclosure.

As shown in FIG. 6, trench 111 and via 113 are filled with a conductive layer 602 that is in contact with conductive interconnection layer 103. Conductive layer 602 formed in trench 111 can be conductive lines that are electrically coupled to conductive interconnection layer 103. In some embodiments, the composition of conductive layer 602 includes suitable metals such as, for example, Ag, Al, Au, Cu, Ru, Co, Ni, W, Mn, Mo, CoW, CoWP, other suitable materials, and/or combinations thereof. Conductive layer 602 can be deposited by any suitable filling processes such as, for example, CVD, PVD, ALD, MBE, HDPCVD, MOCVD, RPCVD, PECVD, plating, other suitable methods, and/or combinations thereof. In some embodiments, the filling process can be a bottom up plating process where the conductive layer growth starts at a bottom of via 113 and progresses upwards until trench 111 and via 113 are filled. In some embodiments, conductive layer 602 can be formed using suitable electrochemical plating processes. In some embodiments, the plating process can be an electroless plating process having a chemical bath using formaldehyde or glyoxyic acid as a reduction agent. The bath can also include a copper organic compound solvent. A seed layer having a same or different material as conductive layer 602 can be formed on surfaces of graphene based barrier layer 506 within trench 111 and via 113 prior to the formation of the conductive layer 602. The seed layer can be formed by any suitable processes such as, for example, CVD, PVD, ALD, MBE, HDPCVD, MOCVD, RPCVD, PECVD, other suitable methods, and/or combinations thereof. In some embodiments, there can be an overfill of the material that form conductive layer 602 above the horizontal plane 401 of first dielectric layer 108.

After depositing conductive layer 602, the top surfaces of semiconductor interconnect structure 100 can be planarized using suitable processes. Excessive material of conductive layer 602 and graphene barrier layer 506 that are formed over the horizontal plane 401 of first dielectric layer 108 can be removed using suitable processes such as, dry etching, wet etching, reactive ion etching, and/or other etching methods. Any other suitable methods may alternatively be utilized such as, for example, a chemical mechanical polishing (CMP) process that can also planarize the surfaces of first dielectric layer 108, graphene barrier layer 506, and conductive layer 602. In some embodiments, a CMP process can be performed to remove the excessive material of conductive layer 602 followed by an etch process that removes portions of graphene barrier layer 506.

FIG. 7 is a cross-sectional view of a partially-fabricated semiconductor interconnect structure after depositing a pre-fill layer and a conductive layer, in accordance with some embodiments of the present disclosure.

The large aspect ratios of vias and trenches in dual damascene metallization processes can cause difficulties during electrochemical plating processes such as, for example, the formation of voids in the trenches or vias. A via pre-fill process can be utilized to reduce voids formed within dual damascene metal layers such as, for example, vias of semiconductor interconnect structures. Prior to forming conductive layers using an electrochemical plating process, a pre-fill layer can be selectively deposited to fill vias, thereby avoiding the formation of voids in vias. Conductive layers are then deposited in the trenches. Therefore, the pre-fill layer and conductive layer can be considered as via-fill and trench-fill layers respectively.

As shown in FIG. 7, a pre-fill layer 702 is deposited to fill via 113 of the partially-fabricated semiconductor interconnect structure 100 as described with reference to FIG. 5. In some embodiments, via 113 can have a width in a range of about 1 angstrom to about 100 angstroms. A conductive layer 704 is then deposited over pre-fill layer 702 to fill trench 111. Pre-fill layer 702 and conductive layer 704 can be either same or different materials. For example, compositions of pre-fill layer 702 and conductive layer 704 can both include copper, or their composition can include Ag, Al, Au, Cu, Ru, Co, Ni, W, Mn, Mo, CoW, CoWP, iridium (Ir), Osmium (Os), other suitable materials, and/or combinations thereof. Both pre-fill layer 702 and conductive layer 704 can be electrically coupled to conductive interconnection layer 103. Pre-fill layer 702 can be formed by any suitable processes such as, for example, electroless deposition (ELD), CVD, PVD, ALD, MBE, HDPCVD, MOCVD, RPCVD, PECVD, other suitable methods, and/or combinations thereof. In some embodiments, conductive layer 704 can be formed using suitable electrochemical plating processes. In some embodiments, the plating process can be an electroless plating process having a chemical bath using formaldehyde or glyoxyic acid as a reduction agent. The bath can also include a copper organic compound solvent. A seed layer having a same or different material as conductive layer 704 can be formed on surfaces of graphene based barrier layer 506 within trench 111 prior to the formation of conductive layer 704. The seed layer can be formed by any suitable processes such as, for example, ELD, CVD, PVD, ALD, MBE, HDPCVD, MOCVD, RPCVD, PECVD, other suitable methods, and/or combinations thereof.

In some embodiments, pre-fill layer 702 can be selectively deposited in via 113 due to incubation on different surfaces. The selectivity can be adjusted through any suitable means such as, for example, surface catalytic reaction, nucleation sites, hydrophilic/hydrophobic properties of surfaces, other suitable factors, and/or combinations thereof. For example, precursors used in ALD or CVD processes for depositing pre-fill layers react with substrate surfaces through chemical reactions, and different chemical reactions can result in different deposit rates. In some embodiments, catalytic effects on metal surfaces can increase the precursor deposition rate on metal surfaces, while hydrophobic surfaces can inhibit precursor deposition. In another example, chemical functional groups of the precursors have different nucleation between surfaces, resulting in growth selectivity. Therefore, pre-fill layer 702 can be selectively deposited at least in a portion of via 113 in a bottom-up fashion by first forming on the exposed metal surfaces. In some embodiments, the top surface of pre-fill layer 702 can be higher or lower than the interface between via 113 and trench 111. For example, there can be an overfill of pre-fill layer 702 in via 113 that forms portions of pre-fill layer 702 in trench 111. In some embodiments, pre-fill layer 702 is deposited until its top surface is coplanar with the interface between via 113 and trench 111. The depth of pre-fill layer 702 can be controlled by a timed deposition process where a longer deposition time can result in a greater depth of deposited material. In some embodiments, chemical additives can be added during the deposition process to further control the deposition rate and the depth of the deposited material. Alternatively, via 113 and pre-fill layer 702 can be formed by depositing first dielectric layer 108 over substrate 102, opening via 113 in first dielectric layer 108, and depositing pre-fill layer 702. A second dielectric layer, trench 111, and conductive layer 704 can also be formed over via 113 and pre-fill layer 702, in accordance with some embodiments. An example of the second dielectric layer is second dielectric layer 110 as described above with reference to FIG. 1A, and is not shown in FIG. 7 for simplicity. In some embodiments, the top surface of conductive layer 704 can be higher than the horizontal plane 401 of the first dielectric layer 108. For example, there can be an overfill of conductive layer 704 that forms excessive portions of conductive layer 704 above the horizontal plane 401 of first dielectric layer 108, in accordance with some embodiments.

After depositing conductive layer 704, the top surfaces of semiconductor interconnect structure 100 can be planarized using suitable processes. Excessive portions of conductive layer 704 and graphene barrier layer 506 that are formed over the horizontal plane 401 of first dielectric layer 108 can be removed using suitable processes such as, dry etching, wet etching, reactive ion etching, and/or other etching methods. Any other suitable methods may alternatively be utilized such as, for example, a CMP process that can also planarize the surfaces of first dielectric layer 108, graphene barrier layer 506, and conductive layer 704. Therefore, at least a portion of graphene barrier layer 506 is formed between first dielectric layer 108 and the deposited conductive material such as pre-fill layer 702 and conductive layers 602 and 704.

Figure 8:
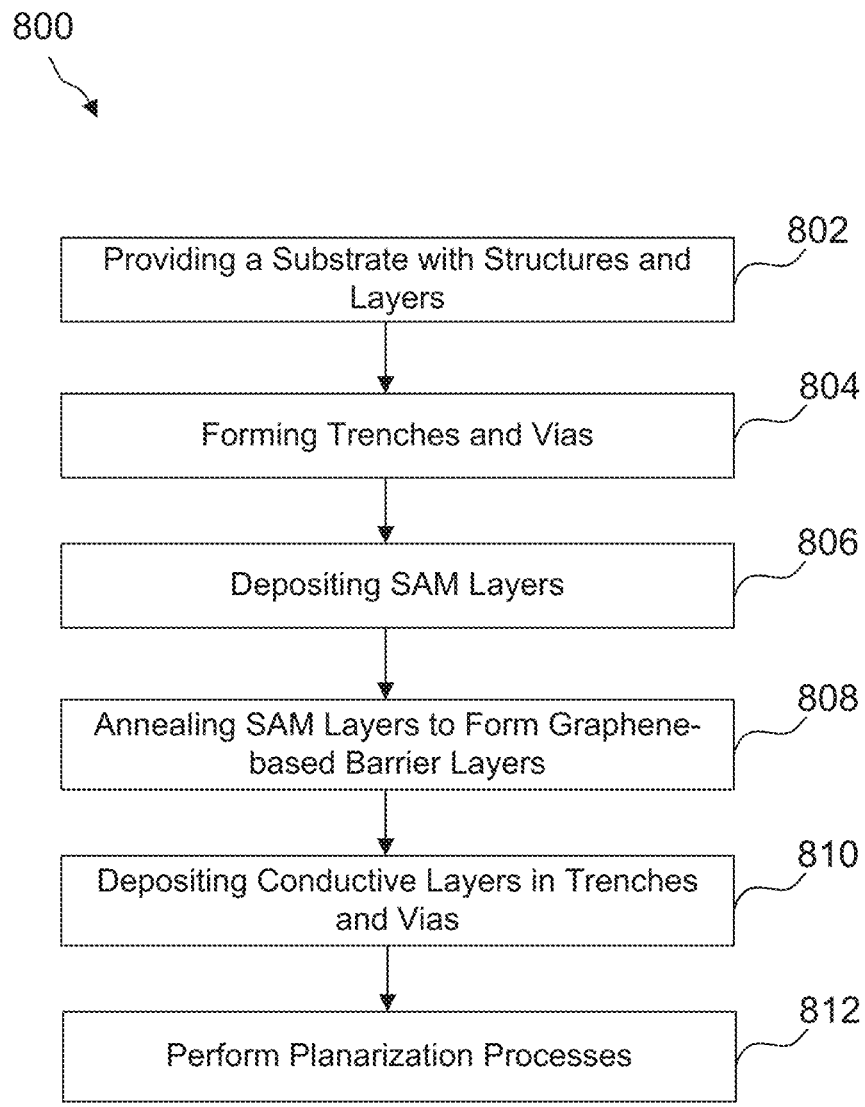
FIG. 8 is a flow diagram of an exemplary method of forming graphene-based barrier layers in semiconductor interconnect structures using SAM layers, in accordance with some embodiments.

FIG. 8 is a flow diagram of an exemplary method 800 of forming graphene-based barrier layer using SAM layers in semiconductor interconnect structures, in accordance with some embodiments of the present disclosure. Based on the disclosure herein, other operations in method 800 can be performed. Further, the operations of method 800 can be performed in a different order and/or vary.

At operation 802, structures and layers are formed on and/or within a semiconductor interconnect structure, in accordance with some embodiments. The semiconductor interconnect structure can include a substrate, a conductive interconnection layer, conductive layers, and one or more dielectric layers. The semiconductor structure can also include other layers as needed. Examples of the substrate, conductive interconnection layer, conductive layers, and one or more dielectric layers are described above with respect to FIGS. 1A-1D.

At operation 804, trenches and vias are formed in the semiconductor interconnect structure, in accordance with some embodiments. The semiconductor interconnect structure can be used to connect metal lines of multilayers in semiconductor devices and formed using damascene, dual damascene, self-aligned dual damascene, and/or other suitable methods. The dual damascene process can include multiple patterning and etch steps such as, for example, a first patterning/etch step that forms vias in the dielectric layer so as to provide electrical connection with the underlying metal layer, and a second patterning/etch step to form trenches for the conductive lines. The two patterning/etch steps can be performed in different orders, for example, in a (i) trench first then via order such as the process described above with respect to FIGS. 1A-1D; or (ii) via first then trench order such as the process described above with respect to FIGS. 2A-2D. The dual damascene process can also be a self-aligned dual damascene process using etch stop layers.

At operation 806, a SAM layer is deposited in the semiconductor interconnect structure, in accordance with some embodiments. The SAM layer can be deposited over exposed surfaces of the partially-fabricated semiconductor structure, and the head group of the SAM layer is selected such that the SAM layer displays an affinity for dielectric surfaces. Therefore, the SAM layer can be formed on the exposed surfaces of the dielectric layer, for example, the horizontal plane of the dielectric layer and the exposed surfaces in trenches and the vias. Further, the head group of the SAM layer can be selected to have an aversion for metal surfaces, thus the SAM layer is not formed on the exposed metal surfaces of the conduction interconnect layer. A nominal thickness of the SAM layer can be achieved by choosing the corresponding alkyl group, and the thickness can be in a range of about 1 angstrom to about 100 angstroms. The SAM layer can be deposited using any suitable processes such as, for example, wet chemical solution, spin-on, CVD, PECVD, ALD, PEALD, and/or other suitable processes. The processing temperature of the SAM layer is in a range of about room temperature to about 1000° C. In some embodiments, the processing temperature is in a range of about room temperature to about 450° C. An example of the SAM layer formation on the exposed surfaces of the dielectric layer is described above with respect to FIG. 4A.

At operation 808, an annealing process is performed to form a graphene-based barrier layer in the semiconductor interconnect structure, in accordance with some embodiments. The terminal end R of the SAM layer can be functional groups that can form graphene or graphene-based barrier layers through annealing processes. For example, the functional groups of terminal end R can be alkyl groups ($C_xH_y$) which can form a graphene layer through an annealing process. In some embodiments, terminal end R can be biphenyl molecules, and the annealing process can induce graphitization of the SAM layer and transform carbon rings of the biphenyl molecules to form a graphene barrier layer. In some embodiments. The SAM layers can be silane-based materials with different molecular length and functional groups. The thermal energy provided by the annealing process should be sufficient to induce a thermal transition in the deposited SAM layer to form the graphene barrier layer. The annealing temperature to induce graphitization can be in a range of about 200° C. to about 1400° C. In some embodiments, the annealing temperature is in a range of about 200° C. to about 450° C. The annealing process can be done through multiple annealing steps at various temperatures, in accordance with some embodiments. For example, the multiple annealing steps can include annealing steps performed at temperatures of about 200° C., 300° C., 400° C., or any other suitable temperatures. The annealing process can be a multi-step process including steps such as, for example, pre-heating, stable heating, and cooling. In some embodiments, the stable heating process can be performed at about 400° C. for about 600 s. The annealing process can also be done through a single-step annealing process, in accordance with some embodiments. The temperature for the single-step annealing process can be such as, for example, 200° C., 300° C., 400° C., or any other suitable temperature, in accordance with some embodiments. The annealing process can be performed for different periods of time. For example, each step of the multi-step annealing process can be performed for the same or different amount of time. For example, each annealing step in a three-step anneal process can be performed for about 300 s, 300 s, and 60 s, respectively. The annealing time for a single-step annealing process can be performed for any suitable amount of time such as, for example, 600 s, in accordance with some embodiments. In some embodiments, thickness of the graphene barrier layer can be tailored by selecting a corresponding alkyl group for the terminal end R of the SAM layer. For example, the graphene barrier layer can have a thickness less than 10 angstroms and greater than 0, in accordance with some embodiments. Examples of the annealing processes to form the graphene-based barrier layer in the semiconductor interconnect structure is described above with respect to FIGS. 4B-4E.

At operation 810, conductive layers are deposited in trenches and vias of the semiconductor interconnect structure, in accordance with some embodiments. Trenches and vias are filled with a conductive layer that is in contact with the conductive interconnection layer. The conductive layer formed in the trenches can be conductive lines that are electrically coupled to the conductive interconnection layer. In some embodiments, the composition of the conductive layer includes suitable metals such as, for example, Ag, Al, Au, Cu, Ru, Co, Ni, W, Mn, Mo, CoW, CoWP, other suitable materials, and/or combinations thereof. The conductive layer can be deposited by any suitable filling processes such as, for example, CVD, PVD, ALD, MBE, HDPCVD, MOCVD, RPCVD, PECVD, plating, other suitable methods, and/or combinations thereof. In some embodiments, the filling process can be a bottom up plating process where the conductive layer growth starts at a bottom of vias and progresses upwards until trenches and vias are filled. In some embodiments, the conductive layer can be formed using suitable electrochemical plating processes. In some embodiments, the plating process can be an electroless plating process having a chemical bath using formaldehyde or glyoxyic acid as a reduction agent. The bath can also include a copper organic compound solvent. A seed layer having a same or different material as the conductive layer can be formed on surfaces of graphene-based barrier layer within trenches and vias prior to the formation of the conductive layer. The seed layer can be formed by any suitable processes such as, for example, CVD, PVD, ALD, MBE, HDPCVD, MOCVD, RPCVD, PECVD, other suitable methods, and/or combinations thereof. An example of the deposition of conductive layers in trenches and vias of the semiconductor interconnect structure is described above with respect to FIG. 6.

A via pre-fill process can be utilized to reduce voids formed within dual damascene metal layers such as, for example, vias of semiconductor interconnect structures. Prior to forming the conductive layer using an electrochemical plating process, a pre-fill layer can be selectively deposited to fill vias, thereby avoiding the formation of voids in vias. A pre-fill layer is deposited to fill vias and a conductive layer is then deposited over the pre-fill layer to fill the trenches. The pre-fill layer and conductive layer can be either same or different materials. For example, compositions of the pre-fill layer and the conductive layer can both include copper, or the composition of pre-fill layer can include Ag, Al, Au, Cu, Ru, Co, Ni, W, Mn, Mo, CoW, CoWP, other suitable materials, and/or combinations thereof. Both the pre-fill layer and the conductive layer can be electrically coupled to the conductive interconnection layer. The pre-fill layer can be formed by any suitable processes such as, for example, CVD, PVD, ALD, MBE, HDPCVD, MOCVD, RPCVD, PECVD, other suitable methods, and/or combinations thereof. In some embodiments, the conductive layer can be formed using suitable electrochemical plating processes. An example of the via pre-fill process described above with respect to FIG. 7.

At operation 812, the top surfaces of semiconductor interconnect structure can be planarized using suitable processes, in accordance with some embodiments. In some embodiments, there can be an overfill of the conductive layers in the trenches that forms excessive portions of the conductive layer above the horizontal plane of the dielectric layer. Excessive portions of the conductive layer and graphene barrier layer that are formed over the horizontal plane of the dielectric layer can be removed using suitable processes such as, dry etching, wet etching, reactive ion etching, and/or other etching methods. Any other suitable methods may alternatively be utilized such as, for example, a CMP process that can also planarize the remaining surfaces of the dielectric layer, the graphene barrier layer, and the conductive layer.

Various embodiments in accordance with this disclosure provides mechanisms of forming a graphene barrier layer on select surfaces using a SAM layer. To form the graphene barrier layer, a SAM layer with alkyl groups can be formed on the dielectric sidewalls. Through an annealing process, carbon atoms in the alkyl groups can be tightly bonded to form a graphene layer. The thin graphene formation maximizes the volume of the conductive material in the opening. Further, the graphene-based barrier layers formed using SAM layers can avoid the diffusion or oxidation of the conductive material and in turn prevents the formation of metal oxide in and around the conductive contact in semiconductor interconnect structures.

In accordance with various embodiments of this disclosure, using SAM layers to form graphene barrier layers in semiconductor interconnect structures provides, among other things, benefits of (i) low sheet resistance by utilizing the thin thickness of graphene layers and maximizing the volume of conductive material in interconnects structure; (ii) low contact resistance by utilizing the surface selectivity of SAM layer and forming a graphene barrier layer on select surfaces; (iii) enhanced device reliability as graphene-based barrier layers inhibit diffusion and reaction between the layers that are in contact with the barrier layers; (iv) controllable thickness of graphene-based barrier layer by adjusting the SAM layer's thickness; and (v) improved device reliability due to chemical stability and reliability of the graphene barrier layers.

In some embodiments, a semiconductor structure includes a substrate and a metal layer formed in the substrate. The semiconductor structure also includes a dielectric layer formed over the metal layer and an opening formed in the dielectric layer. The surfaces of the dielectric layer and a portion of the metal layer can be exposed. One or more graphene barrier layers are formed on the exposed surfaces of the dielectric layer. A conductive layer can be formed in the opening and is in contact with the portion of the metal layer. The one or more graphene barrier layers can be between the conductive layer and the dielectric layer.

In some embodiments, a semiconductor structure includes a conductive interconnect layer and a dielectric layer formed over the conductive interconnect layer. The semiconductor structure also includes a via-fill layer formed in the dielectric layer and in contact with a portion of the conductive interconnect layer. A trench-fill layer can be formed in the dielectric layer and in contact with the via-fill layer. One or more graphene barrier layers can be formed between the via-fill layer and the dielectric layer. The one or more graphene barrier layers can also be formed between the trench-fill layer and the dielectric layer.

In some embodiments, a method of forming semiconductor structure includes forming a dielectric layer over a metal layer and forming an opening in the dielectric layer. The opening exposes surfaces of the dielectric layer and a top surface of the metal layer. The method also includes forming a self-assembly monolayer (SAM) on the exposed surfaces of the dielectric layer and performing an anneal process on the SAM to form a graphene barrier layer. The method further includes filling the opening with a conductor material. The conductor material can be in contact with the graphene barrier layer and the top surface of the metal layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor structure comprising:
   a substrate;
   a metal layer formed over the substrate;
   a dielectric layer formed over the metal layer;
   a graphene barrier layer formed on side surfaces of the dielectric layer; and a conductive layer formed in contact with a portion of the metal layer, wherein at least a portion of the graphene barrier layer is between the conductive layer and the dielectric layer.

2. The semiconductor structure of claim 1, wherein the graphene barrier layer has a thickness in a range of about 1 angstrom to about 100 angstroms.

3. The semiconductor structure of claim 1, wherein the conductive layer comprises first and second conductive layers.

4. The semiconductor structure of claim 3, wherein the first and second conductive layers are formed using different deposition processes.

5. The semiconductor structure of claim 3, wherein the first conductive layer comprises silver, aluminum, gold, copper, ruthenium, cobalt, nickel, tungsten, manganese, molybdenum, cobalt tungsten, cobalt tungsten phosphorous, or an alloy thereof.

6. The semiconductor structure of claim 3, wherein the first and second conductive layers comprise a via and a trench, respectively.

7. The semiconductor structure of claim 1, wherein the semiconductor structure further comprises an etch stop layer, and the graphene barrier layer is formed on the etch stop layer.

8. The semiconductor structure of claim 1, wherein the graphene barrier layer has a thickness less than about 10 angstroms.

9. A semiconductor structure comprising:
   a conductive interconnect layer;
   a dielectric layer formed over the conductive interconnect layer;
   a first conductive layer formed in the dielectric layer and in contact with a portion of the conductive interconnect layer;
   a second conductive layer formed in the dielectric layer and in contact with the first conductive layer; and
   a graphene barrier layer formed between the first conductive layer and the dielectric layer and between the second conductive layer and the dielectric layer.

10. The semiconductor structure of claim 9, wherein the graphene barrier layer has a thickness less than about 10 angstroms.

11. The semiconductor structure of claim 9, wherein the graphene barrier layer has a thickness in a range of about 1 angstrom to about 100 angstroms.

12. The semiconductor structure of claim 9, wherein the first conductive layer comprises silver, aluminum, gold, copper, ruthenium, cobalt, nickel, tungsten, manganese, molybdenum, cobalt tungsten, cobalt tungsten phosphorous, or an alloy thereof.

13. The semiconductor structure of claim 9, wherein the semiconductor structure further comprises an etch stop layer, and the graphene barrier layer is formed on at least a portion of the etch stop layer.

14. A semiconductor interconnect structure comprising:
   a substrate;
   a metal layer formed over the substrate;
   a patterned dielectric layer over the substrate and over a portion of the metal layer;
   a graphene layer formed on surfaces of the patterned dielectric layer; and
   a conductive layer formed on the graphene layer and in contact with the portion of the metal layer, wherein at least a portion of the graphene layer is between the conductive layer and the dielectric layer.

15. The semiconductor interconnect structure of claim 14, wherein the graphene layer has a thickness in a range of about 1 angstrom to about 100 angstroms.

16. The semiconductor interconnect structure of claim 14, wherein the conductive layer comprises first and second conductive layers.

17. The semiconductor structure of claim 14, wherein a top surface of the conductive layer is coplanar with a top surface of the patterned dielectric layer.

18. The semiconductor interconnect structure of claim 14, further comprising an etch stop layer, and wherein the graphene layer is formed on the etch stop layer.

19. The semiconductor structure of claim 6, wherein a width of the via is in a range of about 50 angstroms to about 5000 angstroms and a depth of the via is in a range of about 50 angstroms to about 1000 angstroms.

20. The semiconductor structure of claim 6, wherein a width of the trench is in a range of about 50 angstroms to about 1000 angstroms and a depth of the trench is in a range of about 50 angstroms to about 1000 angstroms.

* * * * *